(12) United States Patent
Leitz et al.

(10) Patent No.: US 9,934,964 B2
(45) Date of Patent: Apr. 3, 2018

(54) SEMICONDUCTOR HETEROSTRUCTURES HAVING REDUCED DISLOCATION PILE-UPS AND RELATED METHODS

(71) Applicant: Taiwan Semiconductor Manufacturing Company, Ltd., Hsin-Chu (TW)

(72) Inventors: Christopher Leitz, Manchester, NH (US); Christopher J. Vineis, Cambridge, MA (US); Richard Westhoff, Hudson, NH (US); Vicky Yang, Windham, NH (US); Matthew T. Currie, Brookline, MA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/095,828

(22) Filed: Apr. 11, 2016

(65) Prior Publication Data

US 2016/0225609 A1    Aug. 4, 2016

Related U.S. Application Data

(60) Continuation of application No. 14/446,421, filed on Jul. 30, 2014, now Pat. No. 9,309,607, which is a (Continued)

(51) Int. Cl.
*H01L 21/02* (2006.01)
*C30B 25/02* (2006.01)
(Continued)

(52) U.S. Cl.
CPC ........ *H01L 21/0251* (2013.01); *C30B 23/025* (2013.01); *C30B 23/066* (2013.01); (Continued)

(58) Field of Classification Search
None
See application file for complete search history.

(56) References Cited

U.S. PATENT DOCUMENTS 4,963,949 A * 10/1990 Wanlass ............ H01L 21/02381
136/252
5,381,434 A * 1/1995 Bhat ...................... B82Y 20/00
372/45.011

(Continued)

OTHER PUBLICATIONS

Soga et al., "Characterization of epitaxially grown GaAs on Si substrates with III-V compounds intermediate layers by metalorganic chemical vapor deposition," Journal of Applied Physics 57 (10), May 15, 1985, p. 4578-4582.*

*Primary Examiner* — Angel Roman
*Assistant Examiner* — Kevin Quinto
(74) *Attorney, Agent, or Firm* — Slater Matsil, LLP

(57) ABSTRACT

Dislocation pile-ups in compositionally graded semiconductor layers are reduced or eliminated, thereby leading to increased semiconductor device yield and manufacturability. This is accomplished by introducing a semiconductor layer having a plurality of threading dislocations distributed substantially uniformly across its surface as a starting layer and/or at least one intermediate layer during growth and relaxation of the compositionally graded layer. The semiconductor layer may include a seed layer disposed proximal to the surface of the semiconductor layer and having the threading dislocations uniformly distributed therein.

20 Claims, 6 Drawing Sheets

Related U.S. Application Data division of application No. 13/348,778, filed on Jan. 12, 2012, now Pat. No. 8,823,056, which is a continuation of application No. 12/893,777, filed on Sep. 29, 2010, now Pat. No. 8,129,747, which is a division of application No. 11/941,629, filed on Nov. 16, 2007, now Pat. No. 7,829,442, which is a continuation of application No. 10/646,353, filed on Aug. 22, 2003, now Pat. No. 7,375,385.

(60) Provisional application No. 60/405,484, filed on Aug. 23, 2002.

(51) Int. Cl.
*C30B 29/52* (2006.01)
*H01L 21/8238* (2006.01)
*C30B 23/02* (2006.01)
*C30B 23/06* (2006.01)
*C30B 25/18* (2006.01)

(52) U.S. Cl.
CPC ............ *C30B 25/02* (2013.01); *C30B 25/183* (2013.01); *C30B 29/52* (2013.01); *H01L 21/0245* (2013.01); *H01L 21/0262* (2013.01); *H01L 21/02381* (2013.01); *H01L 21/02505* (2013.01); *H01L 21/02532* (2013.01); *H01L 21/823807* (2013.01)

(56) References Cited

U.S. PATENT DOCUMENTS

| | | | |
|---|---|---|---|
| 5,906,951 A * | 5/1999 | Chu | ................. H01L 21/02381 257/E21.122 |
| 6,594,293 B1 | 7/2003 | Bulsara et al. | |
| 2006/0172505 A1 | 8/2006 | Koester et al. | |

* cited by examiner

| % Ge | QUALITATIVE EVALUATION OF DISLOCATION PILE-UP DENSITY | | | |
| --- | --- | --- | --- | --- |
| | $H^* = 0.6\, T_{crit}$ | $H = 1.25\, T_{crit}$ | $H = 2\, T_{crit}$ | $H = 5\, T_{crit}$ |
| 5 | HIGH | MEDIUM | LOW | LOW |
| 10 | HIGH | MEDIUM | MEDIUM | LOW |
| 15 | HIGH | MEDIUM | MEDIUM | LOW |

\* THICKNESS (H) OF THE SEED LAYER RELATIVE TO ITS CRITICAL THICKNESS ($T_{crit}$).

FIG. 3

SEMICONDUCTOR HETEROSTRUCTURES HAVING REDUCED DISLOCATION PILE-UPS AND RELATED METHODS

CROSS-REFERENCE TO RELATED APPLICATION

This application is a continuation of U.S. patent application Ser. No. 14/446,421, filed Jul. 30, 2014, which is a divisional of U.S. patent application Ser. No. 13/348,778, filed Jan. 12, 2012 (now U.S. Pat. No. 8,823,056 Issued Sep. 2, 2014), which is a continuation of U.S. patent application Ser. No. 12/893,777, filed Sep. 29, 2010 (now U.S. Pat. No. 8,129,747 Issued Mar. 6, 2012), which is a divisional of U.S. patent application Ser. No. 11/941,629, filed Nov. 16, 2007 (now U.S. Pat. No. 7,829,442 Issued Nov. 9, 2010), which is a continuation of U.S. patent application Ser. No. 10/646,353, filed Aug. 22, 2003 (now U.S. Pat. No. 7,375,385 Issued May 20, 2008), which claims the benefits of and priority to U.S. Provisional Application Ser. No. 60/405,484, filed on Aug. 23, 2002; the entire disclosures of these applications are hereby incorporated by reference.

FIELD OF THE INVENTION

This application relates generally to semiconductor substrates and specifically to substrates comprising relaxed lattice-mismatched semiconductor layers.

BACKGROUND

The increasing operating speeds and computing power of microelectronic devices have recently given rise to the need for an increase in the complexity and functionality of the semiconductor structures that are used as the starting substrates in these microelectronic devices. Such "virtual substrates" based on silicon and germanium provide a platform for new generations of very large scale integration ("VLSI") devices that exhibit enhanced performance when compared to devices fabricated on bulk Si substrates. Specifically, new technological advances enable formation of heterostructures using silicon-germanium alloys (hereinafter referred to as "SiGe" or "$Si_{1-x}Ge_x$") to further increase performance of the semiconductor devices by changing the atomic structure of Si to increase electron and hole mobility.

The important component of a SiGe virtual substrate is a layer of SiGe heterostructure that has been relaxed to its equilibrium lattice constant (i.e., one that is larger than that of Si). This relaxed SiGe layer can be directly applied to a Si substrate (e.g., by wafer bonding or direct epitaxy), or atop a relaxed graded SiGe buffer layer in which the lattice constant of the SiGe material has been increased gradually over the thickness of the layer. The SiGe virtual substrate may also incorporate buried insulating layers, in the manner of a silicon-on-insulator (SOI) wafer. To fabricate high-performance devices on these platforms, thin strained layers of semiconductors, such as Si, Ge, or SiGe, are grown on the relaxed SiGe virtual substrates. The resulting biaxial tensile or compressive strain alters the carrier mobilities in the layers, enabling the fabrication of high-speed and/or low-power-consumption devices. The percentage of Ge in SiGe and the method of deposition can have a dramatic effect on the characteristics of the strained Si layer. U.S. Pat. No. 5,442,205, "Semiconductor Heterostructure Devices with Strained Semiconductor Layers," incorporated herein by reference, describes one such method of producing a strained Si device structure.

An approach to epitaxially growing a relaxed SiGe layer on bulk Si is discussed in International Application Publication No. WO 01/22482, entitled "Method of Producing Relaxed Silicon Germanium Layers" and incorporated herein by reference. The method includes providing a monocrystalline Si substrate, and then epitaxially growing a graded $Si_{1-x}Ge_x$ layer with increasing Ge concentration at a gradient of less than 25% Ge per micrometer to a final Ge composition in the range of 0.1<x<1, using a source gas of $Ge_xH_yCl_z$ for the Ge component, on the Si substrate at a temperature in excess of 850° C., and then epitaxially growing a semiconductor material on the graded layer.

Another method of epitaxially growing a relaxed SiGe layer on bulk Si is discussed in a paper entitled, "Low Energy plasma enhanced chemical vapor deposition," by M. Kummer et al. (*Mat. Sci. & Eng. B*89, 2002, pp. 288-95) and incorporated herein by reference, in which a method of low-energy plasma-enhanced chemical vapor deposition (LEPECVD) is disclosed. This method allows the formation of a SiGe layer on bulk Si at high growth rates (0.6 μm per minute) and low temperatures (500-750° C.).

To grow a high-quality, thin, epitaxial strained Si layer on a graded SiGe layer, the SiGe layer is, preferably, planarized or smoothed to reduce the surface roughness in the final strained Si substrate. Current methods of chemical mechanical polishing ("CMP") are typically used to decrease roughness and improve the planarity of surfaces in semiconductor fabrication processes. U.S. Pat. No. 6,107,653, "Controlling Threading Dislocations in Ge on Si Using Graded GeSi Layers and Planarization," incorporated herein by reference, describes how planarization can be used to improve the quality of SiGe graded layers.

One technique suitable for fabricating strained Si wafers can include the following steps:

1. Providing a silicon substrate that has been edge-polished;
2. Epitaxially depositing a relaxed graded SiGe buffer layer to a final Ge composition on the silicon substrate;
3. Epitaxially depositing a relaxed $Si_{1-x}Ge_x$ cap layer having a constant composition on the graded SiGe buffer layer;
4. Planarizing or smoothing the $Si_{1-x}Ge_x$ cap layer and/or the relaxed graded SiGe buffer layer by, e.g., CMP;
5. Epitaxially depositing a relaxed $Si_{1-x}Ge_x$ regrowth layer having a constant composition on the planarized surface of the $Si_{1-x}Ge_x$ cap layer; and
6. Epitaxially depositing a strained silicon layer on the $Si_{1-x}Ge_x$ regrowth layer.

By introducing strain gradually over a series of low lattice mismatch interfaces, compositionally graded layers, as recited in step 2 above, offer a viable route toward integration of heavily lattice-mismatched monocrystalline semiconductor layers on a common substrate, offering a route towards increased functionality through monolithic integration.

The lattice constant of SiGe is larger than that of Si, and is a direct function of the amount of Ge in the SiGe alloy. As the SiGe graded buffer layer is epitaxially deposited, it will initially be strained to match the in-plane lattice constant of the underlying silicon substrate. However, above a certain critical thickness, the SiGe graded buffer layer will relax to its inherently larger lattice constant. The process of relaxation occurs through the formation of misfit dislocations at the interface between two lattice-mismatched layers, e.g., a Si substrate and a SiGe epitaxial layer (epilayer). Because dislocations cannot terminate inside a crystal, misfit dislocations have vertical dislocation segments at each end (termed "threading dislocations"), that may rise through the crystal to reach a top surface of the wafer. Both misfit and threading dislocations have stress fields associated with them. As explained by Eugene Fitzgerald et al., *Journal of Vacuum Science and Technology B*, Vol. 10, No. 4, 1992 (hereafter, "Fitzgerald et al."), incorporated herein by reference, the stress field associated with the network of misfit dislocations affects the localized epitaxial growth rate at the surface of the crystal. This variation in growth rates may result in a surface cross-hatch on lattice-mismatched, relaxed graded SiGe buffer layers grown on Si.

The deposition of the relaxed graded SiGe buffer layer enables engineering of the in-plane lattice constant of the SiGe cap layer (and therefore the amount of strain in the strained silicon layer), while reducing the introduction of dislocations. For example, compositionally graded SiGe layers grown on Si(001) offer at least a three-order-of-magnitude reduction in threading dislocation density (TDD) when compared to direct deposition of relaxed SiGe layers without such buffer layer, and the resulting relaxed SiGe layer acts as a "virtual substrate" for high mobility strained channels (e.g. strained Si). The stress field associated with misfit dislocations under certain conditions, however, may cause formation of linear agglomerations of threading dislocations, termed a "dislocation pile-up."

A dislocation pile-up is generally defined as an area comprising at least three threading dislocations, with a threading dislocation density greater than $5 \times 10^6/cm^2$, and with threading dislocations substantially aligned along a slip direction such that the linear density of dislocations within the pile-up and along a slip direction is greater than 2000/cm. For example, the slip directions in SiGe materials are in-plane <110> directions.

Numerous theories attempt to explain the nucleation of misfit dislocations regarding where they are formed in the crystal and by what process. These theories include formation at pre-existing substrate dislocations; heterogeneous formation at defects; and homogeneous formation, i.e., formation in defect-free, perfect crystal regions. As explained by Eugene Fitzgerald in an article published in *Materials Science Reports*, Vol. 7, No. 3, 1991 and incorporated herein by reference, however, the activation energy for homogeneous dislocation formation is so high that it is unlikely to occur. The most likely source of misfit dislocations in the crystal is heterogeneous nucleation at defects.

Thus, dislocation pile-ups can form through a variety of mechanisms, including heterogeneous nucleation from particles, nucleation from wafer edges, dislocation blocking via interactions with surface roughness (especially deep troughs in the characteristic crosshatch pattern) and buried dislocation strain fields, or untraceable nucleation events during growth of thick compositionally graded buffer layers.

As described in the article by Srikanth Samavedam et al. (published in *Journal of Applied Physics*, Vol. 81, No. 7, 1997, and incorporated herein by reference), a high density of misfit dislocations in a particular region of a crystal will result in that region having a high localized stress field. This stress field may have two effects. First, it may present a barrier to the motion of other threading dislocations attempting to glide past the misfits. This pinning or trapping of threading dislocations due to the high stress field of other misfit dislocations is known as work hardening. Second, the high stress field may strongly reduce the local epitaxial growth rate in that region, resulting in a deeper trough in the surface morphology in comparison to the rest of the surface crosshatch. This deep trough in the surface morphology may also pin threading dislocations attempting to glide past the region of high misfit dislocation density (MDD). This cycle may perpetuate itself and result in a linear region with a high density of trapped threading dislocations, i.e., a dislocation pile-up.

Thus, while the graded buffer approach has demonstrated considerable reduction of global threading dislocation density, the stress field associated with misfit dislocations under certain conditions may cause dislocation pile-up defects in the semiconductor heterostructure. Regardless of the specific mechanism behind pile-up formation, a high localized TDD present in dislocation pile-ups has a potentially devastating impact on the yield of devices formed in these regions and may render these devices unusable. Inhibiting the formation of dislocation pile-ups is, therefore, desirable.

SUMMARY OF THE INVENTION

It is an object of the present invention to provide a relaxed lattice-mismatched semiconductor heterostructure that overcomes the limitations of known semiconductor structures.

In various aspects of the present invention, dislocation pile-ups in compositionally graded semiconductor layers are reduced or substantially eliminated, thereby leading to increased semiconductor device yield and manufacturability. This is accomplished by introducing a semiconductor layer having a plurality of threading dislocations distributed substantially uniformly across its surface as a starting layer prior to the subsequent growth and relaxation of the compositionally graded layer and, optionally, as at least one intermediate layer during growth of the graded layer. This semiconductor layer may include a so-called "seed layer" disposed proximal to the surface of the semiconductor layer and having substantially uniformly distributed threading dislocations.

Also, it has been found that acceptable TDDs and dislocation pile-up densities (DPDs) in graded layers can be achieved at relatively high concentration gradients (e.g., in excess of 25% Ge per μm of thickness) through the use of the seed layer. In tandem or as a further improvement, the rate of deposition (i.e., the epitaxial growth rate) is kept sufficiently low to prevent high TDD and DPD. The result is a thinner overall structure that is less bowed and more economical, in terms of applied material, than structures with graded layers formed at lower gradients (e.g., as described in U.S. Pat. No. 5,221,413 (hereafter, "'413 patent")).

In general, in one aspect, the invention is directed to a semiconductor structure that includes a first semiconductor layer having a plurality of threading dislocations distributed substantially uniformly across a surface thereof; and a substantially relaxed compositionally uniform cap layer disposed over the surface of the first layer. In one embodiment, a lattice constant of the compositionally uniform cap layer is different from a lattice constant of the first layer.

The compositionally uniform cap layer may include at least one of a group II, a group III, a group IV, a group V, and a group VI element, for example, at least one of silicon and germanium. In one embodiment, the compositionally uniform cap layer includes more than approximately 10% germanium. The thickness of the compositionally uniform cap layer may range from about 0.5 μm to about 3.0 μm.

In various embodiments, the semiconductor structure also includes a strained semiconductor layer disposed over the compositionally uniform cap layer. The strained semiconductor layer may be tensilely strained and include, for example, tensilely strained silicon or tensilely strained silicon-germanium alloy, or compressively strained and include, for example, compressively strained germanium or compressively strained silicon-germanium alloy.

Also, the semiconductor structure may include a compositionally graded layer disposed between the compositionally uniform cap layer and the first layer. The graded layer may include at least one of a group II, a group III, a group IV, a group V, and a group VI element, for example, at least one of silicon and germanium. In one embodiment of the invention, the graded layer comprises silicon and germanium and has a grade rate greater than about 5% germanium per micrometer. In one version of this embodiment, the grade rate less than about 50% germanium per micrometer. In some embodiments, the graded layer is graded to a concentration of greater than about 10% germanium. The thickness of the graded layer may range from about 0.5 μm to about 10.0 μm.

In a particular embodiment of the invention, the first layer of the semiconductor structure includes an initial portion of the graded layer having a lower local grading rate than at least one subsequent portion of the graded layer. The threading dislocations are uniformly distributed in the initial portion. In some versions of this embodiment, the graded layer includes at least one of silicon and germanium. The difference in local grading rate may be greater than about 5% Ge/μm, for example, greater than about 20% Ge/μm. In one version of this embodiment, the grading rate of the initial portion of the relaxed graded buffer layer does not exceed about 10% Ge/μm. In another version, the discontinuity in Ge content at the interface between the initial portion and at least one subsequent portion of the relaxed graded layer does not exceed about 10% Ge, for example, does not exceed about 5% Ge.

In various embodiments, the first semiconductor layer includes a seed layer disposed proximal to the surface of the first layer. The threading dislocations may be uniformly distributed in the seed layer. The seed layer may be at least partially relaxed and compositionally either uniform or graded. Further, the thickness of the seed layer may exceed twice its equilibrium critical thickness. In some versions, the thickness of the seed layer is less than about five times its equilibrium critical thickness. At least a portion of the seed layer can be formed by growth at a growth temperature of about 850° C., for example, above 1000° C. The thickness of the seed layer may range from about 10 nm to about 1000 nm, for example, from about 30 nm to about 300 nm.

The cap layer, according to various embodiments of the invention, may have a DPD of less than about 1/cm, for example, less than 0.01/cm, and a TDD of less than about $5 \times 10^5$/cm².

In some version of this embodiment of the invention, the semiconductor structure also includes a compositionally graded layer disposed between the compositionally uniform cap layer and the seed layer. At least one of the graded layer and the seed layer may include at least one of silicon and germanium. According to one feature, a concentration of germanium in the graded layer is different than a concentration of germanium in the seed layer at an interface between the seed layer with the graded layer. Specifically, discontinuity in germanium concentration at an interface between the seed layer with the graded layer may range from about 2% to 50% Ge, for example, from about 5% to 15% Ge. In one embodiment, the semiconductor structure also includes at least one intermediate seed layer disposed within the graded layer.

In some embodiments, the semiconductor structure also includes a compositionally uniform buffer layer disposed between the compositionally uniform cap layer and the seed layer. The buffer layer may include silicon. In some versions of this embodiment, at least one of the buffer layer and the seed layer includes at least one of silicon and germanium. A concentration of germanium in the buffer layer may be different than a concentration of germanium in the seed layer at an interface between the seed layer with the buffer layer. The discontinuity in germanium concentration at an interface between the seed layer with the buffer layer may range from about 2% to 50% Ge, for example, from about 5% to 15% Ge.

In general, in another aspect, the invention features a method of fabricating a semiconductor structure having reduced threading dislocation pile-ups. The method includes the steps of providing a first semiconductor layer having a plurality of threading dislocations distributed substantially uniformly across a surface thereof; and forming a substantially relaxed and compositionally uniform cap layer over the surface of the first semiconductor layer. The first semiconductor layer inhibits formation of dislocation pile-ups in at least the cap layer.

In some embodiments, a lattice constant of the compositionally uniform cap layer is different from a lattice constant of the first layer. In other embodiments, the method further includes the step of forming a compositionally uniform buffer layer over the first layer prior to forming the cap. Also, the step of providing a first semiconductor layer according to the invention may include forming an at least partially relaxed seed layer over a semiconductor substrate, for example, by growing the seed layer to a thickness ranging between two and five times an equilibrium critical thickness of the seed layer. The method may also include the step of annealing the seed layer at a temperature above the deposition temperature thereof.

In other embodiments, the step of providing a first semiconductor layer includes implanting a species into the first semiconductor layer. The species, as well as the first semiconductor layer may include silicon.

In still other embodiments, the step of providing a first semiconductor layer includes providing a semiconductor-on-insulator substrate. Alternatively, the step of providing a first semiconductor layer may include providing a silicon substrate having a substantially uniform distribution of threading dislocations. A density of threading dislocations in the silicon substrate may exceed about $10^2$/cm². An average surface roughness of the silicon substrate may be greater than 1 Å, for example, greater than 5 Å.

In some embodiments, the method of the invention also includes the step of forming a compositionally graded layer prior to forming the cap layer, and, optionally, forming at least one seed layer within the compositionally graded buffer layer.

In yet another aspect, the invention features a method of forming a relaxed graded semiconductor layer on a substrate. The method according to this aspect of the invention includes the steps of providing a first semiconductor layer; and epitaxially growing over the first semiconductor layer a relaxed graded layer including at least one of silicon and germanium, with increasing germanium content at a gradient exceeding about 25% Ge/μm to a final composition having a germanium content ranging from greater than 0% to 100% and a threading dislocation density not exceeding about $10^7$/cm².

This aspect of the invention may include the following features. The graded layer may have a dislocation pile-up density not exceeding about 20/cm, for example, not exceeding about 1/cm or, as a further example, not exceeding about 0.01/cm. The grading rate may be at least 30% Ge/μm, for example, at least 40% Ge/μm. The epitaxial growth may occur at a temperature ranging from 900-1200° C., and at a rate greater than about 1 nm/s. The relaxed graded layer may have a thickness ranging from 0.1 to 4.0 μm.

In one embodiment, the first semiconductor layer has a plurality of threading dislocations distributed substantially uniformly across a surface thereof, and the method further includes the step of providing a compositionally uniform cap layer over the surface of the first layer. The cap layer is substantially relaxed, and the relaxed graded layer is grown over the cap layer.

In still another aspect, the invention features a semiconductor structure including a first semiconductor layer and, thereover, a relaxed graded epitaxial layer comprising silicon and germanium and graded with increasing germanium content at a gradient exceeding 25% Ge/μm to a final composition having a germanium content ranging from greater than 0% to 100%, wherein the structure has a threading dislocation density not exceeding $10^7/cm^2$. The dislocation pile-up density in this structure does not exceed 1/cm, for example, does not exceed 0.01/cm.

In still another aspect of the invention, the semiconductor structure includes a semiconductor substrate; a compositionally graded layer disposed over the substrate; and a substantially relaxed compositionally uniform cap layer disposed over the compositionally graded layer. The cap layer has a density of dislocation pile-ups less than 1/cm, for example, less than 0.01/cm.

In further aspects of the invention, the semiconductor structure includes a first semiconductor layer having a plurality of threading dislocations distributed substantially uniformly across a surface thereof; a compositionally uniform cap layer disposed over the surface of the first layer, the cap layer being substantially relaxed; and also either (or both of) a p-type metal-oxide-semiconductor (PMOS) transistor or an n-type metal-oxide-semiconductor (NMOS) transistor disposed over the relaxed cap layer.

The PMOS transistor may include a gate dielectric portion disposed over a portion of the relaxed cap layer and a gate disposed over the gate dielectric portion. The gate comprises a conducting layer, and a source and a drain including p-type dopants are disposed proximate the gate dielectric portion.

The NMOS transistor may include a gate dielectric portion disposed over a portion of the relaxed cap layer and a gate disposed over the gate dielectric portion. The gate comprises a conducting layer and a source and a drain including n-type dopants are disposed proximate the gate dielectric portion.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 3 depicts a table containing qualitative evaluation of DPD for seed layers of different thickness and germanium content according to various embodiments of the invention;

DETAILED DESCRIPTION

In accordance with various embodiments of the present invention, a semiconductor layer having a plurality of threading dislocations distributed substantially uniformly across its surface is used as a starting layer prior to the subsequent growth and relaxation of the compositionally graded layer and, optionally, as at least one intermediate layer during growth of the graded layer.

Figure 1:
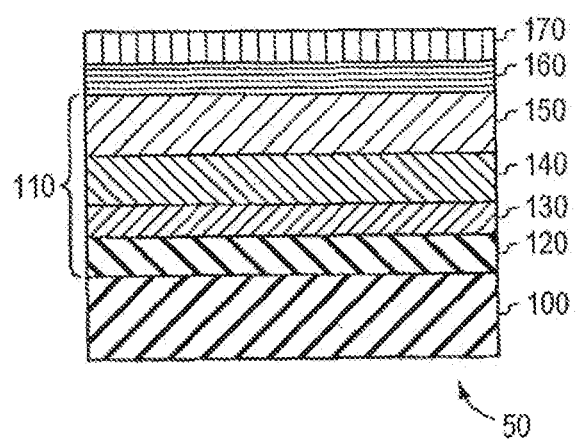
FIG. 1 depicts a schematic cross-sectional view of a semiconductor substrate with semiconductor layers formed thereon according to one embodiment of the invention.

Referring to FIG. 1, a semiconductor structure 50 made in accordance with the embodiments of the invention includes a substrate 100. The substrate 100, suitable for use with the invention, comprises a semiconductor, such as silicon, silicon deposited over an insulator, such as, for example, $SiO_2$, or a silicon-germanium alloy. In one embodiment, several semiconductor layers collectively referred to as layers 110 are epitaxially grown over the substrate 100. In this embodiment, the layers 110 and the substrate 100 may be referred to together as a "virtual substrate."

The epitaxially grown layers 110 can be grown in any suitable epitaxial deposition system, including, but not limited to, atmospheric-pressure CVD (APCVD), low- (or reduced-) pressure CVD (LPCVD), ultra-high-vacuum CVD (UHVCVD), or by molecular beam epitaxy. The epitaxial growth system may be a single-wafer or multiple-wafer batch reactor. The growth system also may utilize low-energy plasma to enhance the layer growth kinetics.

Suitable CVD systems commonly used for volume epitaxy in manufacturing applications include, for example, EPI CENTURA single-wafer multi-chamber systems available from Applied Materials of Santa Clara, Calif., or EPSILON single-wafer epitaxial reactors available from ASM International based in Bilthoven, The Netherlands.

In the CVD process, obtaining epitaxial growth typically involves introducing a source gas into the chamber. The source gas may include at least one precursor gas and a carrier gas, such as, for example hydrogen. In those embodiments of the invention where the layers are formed from Si, silicon precursor gases such as, for example, silane, disilane, trisilane, or dichlorosilane (DCS) trichlorosilane (TCS), or silicon tetrachloride may be used. Conversely, in those embodiments of the invention where the layers are formed from Ge, germanium precursor gases, such as, for example, germane ($GeH_4$), digermane, germanium tetrachloride, or dichlorogermane, or other Ge-containing precursors may be used. Finally, in the embodiments where the layers are formed from SiGe alloy, a combination of silicon and germanium precursor gases in various proportions is used.

In various embodiments of the invention, a compositionally graded or compositionally uniform seed layer 120, described in detail below, is epitaxially deposited over the substrate 100. Also, as described in detail below, a compositionally uniform buffer layer 130 may be deposited over the seed layer 120.

Still referring to FIG. 1, a relaxed compositionally graded layer 140 is epitaxially deposited over the substrate 100 (and, if present, layers 120 and/or 130) in accordance with the parameters described herein. The relaxed graded layer 140 may include Si and Ge with a grading rate of, for example, over about 5% Ge per μm of thickness, and generally in the range of >5% Ge/μm to 100% Ge/μm, preferably between 5% Ge/μm and 50% Ge/μm, to a final Ge content of between about 10% to about 100% Ge. While the overall grading rate of the relaxed graded layer is generally defined as the ratio of total change in Ge content to the total thickness of the layer, a "local grading rate" within a portion of the graded layer may be different from the overall grading rate. For example, a graded layer including a 1 μm region graded from 0% Ge to 10% Ge (a local grading rate of 10% Ge/μm) and a 1 μm region graded from 10% Ge to 30% Ge (a local grading rate of 20% Ge/μm) will have an overall grading rate of 15% Ge/μm. Thus, a relaxed graded layer may not necessarily have a linear profile, but may comprise smaller regions having different local grading rates.

The compositional grading in layer 140 may be accomplished, for example, by either linear grading or step grading, in which discrete steps in Ge composition are taken (e.g., 200 nm jumps of 2% Ge for a final grade rate of 10% Ge/μm). The highest grading rate that can be achieved with an acceptable TDD and DPD is ordinarily preferred in order to minimize layer thickness and the use of source gases. Acceptable TDD levels are typically less than $10^7/cm^2$ and preferably less than $5 \times 10^5/cm^2$, while acceptable DPD levels are typically less than 20/cm and preferably between 0 and 5/cm. For example, in the case of Si and Ge, grading rates in the range of 30-50% Ge/μm are found to be advantageous. Defect densities are measured using a standard chromic acid-based Schimmel etch as outlined in *Journal of the Electrochemical Society* 126:479 (1979), and an optical microscope operated in differential interference contrast (Nomarski) mode. Threading dislocation densities are calculated by counting the number of etch pits per unit area located away from dislocation pile-ups, yielding units of inverse area ($cm^{-2}$). Dislocation pile-up densities are calculated by measuring the total length of dislocation pile-ups per unit area, yielding units of inverse length ($cm^{-1}$). Defect densities may also preferably be confirmed by the use of a complementary characterization technique such as plan-view transmission electron microscopy.

The thickness of the relaxed graded layer 140 in accordance with the invention may range from, for example, about 0.1 μm to about 10 μm, preferably, between about 0.5 μm and about 4 μm. Additionally, the graded layers 140 may be grown at a temperature ranging, for example, between 600 and 1200° C. Higher growth temperatures, for example, exceeding 900° C. may be preferred to enable faster growth rates while minimizing the nucleation of threading dislocations.

A compositionally uniform (i.e. constant-composition) relaxed cap layer 150 is typically disposed over the graded layer 140. The cap layer 150 may, for example, include $Si_{1-x}Ge_x$ with a uniform composition, containing, e.g., 1-100% Ge, preferably between 10% and 90% Ge, and having a thickness of, for example, 0.2-3 μm, preferably over 0.5 μm. The constant-composition relaxed cap layer 150 and/or graded layer 140 may or may not be planarized or smoothed for surface roughness reduction. Planarization or smoothing may be accomplished by CMP or in situ epitaxy-based methods, for example, although other techniques are acceptable as well. The use of a planarization or smoothing process may result in relaxed cap layer 150 having a surface roughness less than 1 nm. In an alternative embodiment, the relaxed cap layer 150 may be formed directly on the substrate 100, without the graded layer 140.

A compressively strained layer 160 including a semiconductor material may be disposed over the relaxed cap layer 150. In one embodiment, the compressively strained layer 160 includes group IV elements, such as $Si_{1-y}Ge_y$, with a Ge content (y) higher than the Ge content (x) of the relaxed ($Si_{1-x}Ge_x$) cap layer. The compressively strained layer 160 may contain, for example, 1-100% Ge, preferably over 40% Ge, and may have a thickness of, e.g., 10-500 angstroms (Å), preferably below 200 Å. In some embodiments, the compressively strained layer 160 includes at least one group III and one group V element, e.g., indium gallium arsenide, indium gallium phosphide, or gallium arsenide. In alternative embodiments, the compressively strained layer 160 includes at least one group II and one group VI element, e.g., zinc selenide, zinc sulfide, cadmium telluride, or mercury telluride.

A tensilely strained layer 170 may be disposed over the compressively strained layer 160, sharing an interface therewith. In another embodiment, tensilely strained layer 170 is disposed under the compressively strained layer 160. Alternatively, in yet another embodiment, there is no compressively strained layer 160 and instead the tensilely strained layer 170 is disposed over the relaxed cap layer 150, sharing an interface therewith. In still another embodiment, a relaxed constant-composition regrowth layer (not shown) is disposed over the relaxed cap layer, sharing an interface therewith, and a tensilely strained layer is disposed over the constant-composition regrowth layer, sharing an interface with that layer. The regrowth layer may, for example, include $Si_{1-x}Ge_x$ with a uniform composition, containing, e.g., 1-100% Ge and having a thickness of, for example, 0.01-2 μm.

In one embodiment, the tensilely strained layer 170 is formed of silicon. In this embodiment, the strained layer 170 may be formed in a dedicated chamber of a deposition tool that is not exposed to Ge source gases, thereby avoiding cross-contamination and improving the quality of the interface between the tensilely strained layer 170 and either relaxed layer 150 or compressively strained layer 160. Furthermore, tensilely strained layer 170 may be formed from an isotopically pure silicon precursor(s). Isotopically pure Si has better thermal conductivity than conventional Si. Higher thermal conductivity may help dissipate heat from devices subsequently formed on the tensilely strained layer 170, thereby maintaining the enhanced carrier mobilities provided by the strained layer 170.

In other embodiments, the tensilely strained layer 170 may be formed of SiGe, or at least one of a group II, a group III, a group V, and a group VI element. In one embodiment, the tensilely strained layer is silicon having a thickness of, for example, 50-500 Å, preferably below 300 Å.

As mentioned above, according to the invention, dislocation pile-ups in compositionally graded semiconductor layer 140 and relaxed cap layer 150 are reduced or substantially eliminated by introducing a semiconductor layer having a plurality of threading dislocations distributed substantially uniformly across its surface as a starting layer prior to the subsequent growth and relaxation of the compositionally graded layer and, optionally, as at least one intermediate layer during growth of the graded layer. Still referring to FIG. 1, in one embodiment, the so-called "seed layer" 120 is disposed proximal to the surface of the semiconductor substrate 100.

Figure 2:
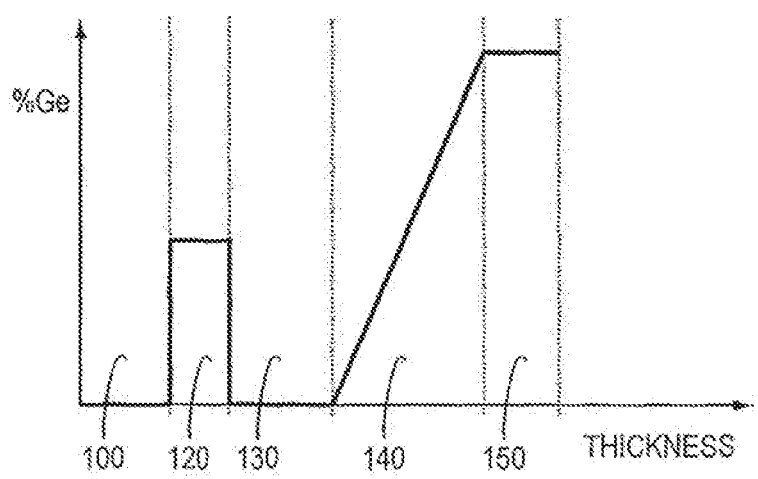
FIG. 2 depicts a graph of germanium concentration in different layers of the semiconductor structure of FIG. 1 plotted versus a schematic representation of its cross-sectional view, according to one version of the embodiment of FIG. 1.

FIG. 2 illustrates one embodiment of the semiconductor structure described with reference to FIG. 1. In this embodiment, this structure comprises SiGe materials and incorporates the seed layer 120. Referring to FIG. 2, Ge concentration is plotted versus schematic representation of the cross-section of the semiconductor device. For clarity, the thicknesses of layers 100-150 has been distorted.

In essence, the seed layer 120 comprises a partially of fully relaxed layer having threading dislocations substantially uniformly distributed therein and a discontinuity in composition between itself and at least one of subsequently deposited layers. The discontinuity in composition may either be positive or negative.

The seed layer 120 leads to a substantially uniform distribution of threading dislocations such that the threading dislocation density in an area does not differ by more than one order of magnitude from the density across the wafer. Moreover, the density of threading dislocations resulting from the seed layer may be greater than 100/cm².

In some embodiments of the invention, for the SiGe materials system, the seed layer 120 may be a $Si_{1-y}Ge_y$ layer grown beyond its critical thickness on a Si substrate, upon which a SiGe graded layer is deposited. In the embodiment depicted in FIG. 2, the seed layer 120 has a uniform composition. In an alternative embodiment, at least a portion of the seed layer 120 is compositionally graded.

The seed layer may be, for example, 10 nm to 1000 nm in thickness. In a particular embodiment, the thickness of the seed layer 120 ranges from about 30 nm to about 300 nm thick. The seed layer 120 may comprise a Ge discontinuity of 2-50% Ge, preferably ranging from about 5% to about 15% Ge.

The seed layer 120 may prevent subsequent dislocation pile-up formation through any of several mechanisms. For example, since the seed layer 120 is partially or fully relaxed, the threading dislocation density in this layer may be substantially homogeneously (i.e. uniformly) distributed. This relaxation process supplies a randomly distributed array of threading dislocations that can be recycled throughout the subsequently deposited graded buffer layers, preventing heterogeneous dislocation distributions from forming during buffer growth and leading to dislocation pile-ups. Similarly, since the seed layer forms a larger initial lattice constant material upon which the graded buffer is deposited, the graded buffer grown on a seed layer ultimately needs to relax less lattice mismatch. This may help to prevent strain build-up during graded buffer growth, which can lead to nucleation of heterogeneous distributions of threading dislocations and ultimately dislocation pile-ups. Next, any residual compressive strain in the seed layer may also increase the effective stress that drives dislocation motion, leading to higher glide velocities and thus more efficient strain relaxation.

Additionally, as described in Eugene Fitzgerald et al., the number of sites activated to nucleate dislocations during layer relaxation is a function of the product of growth temperature and layer strain. Since the seed layer has a high built-in strain before relaxing, this implies that many sites (distributed substantially uniformly across the wafer) will be activated to form dislocations during layer relaxation. Thus, the condition which promotes dislocation pile-ups (namely, activation of only a few, localized sites for dislocation formation during relaxation) will be avoided, reducing the density of dislocation pile-ups.

Finally, the seed layer 120 may also provide surface morphology that counteracts the morphological features known to trap gliding threading dislocations, thereby leading to dislocation pile-ups. For example, the morphology of a partially or fully relaxed seed layer may counter formation of deep troughs in the crosshatch pattern, leading to a more planar surface during growth and fewer dislocation blocking events. Several different embodiments of graded buffers grown with these seed layers are outlined below.

Referring to FIGS. 1 and 2, constant-composition buffer layer 130 is disposed over the seed layer 120. The buffer layer 130 may further facilitate a substantially uniform distribution of threading dislocations prior to subsequent growth of a compositionally graded buffer layer. The buffer layer 130 may have a lower Ge concentration than the seed layer 120, and in some embodiments may contain 0% Ge. In some embodiments, the interface between layers 120 and 130 may additionally reflect an abrupt jump in Ge concentration, either to a lower Ge composition or to a higher Ge concentration. In an alternative embodiment, there may be no constant-composition buffer layer 130 and instead the graded layer 140 may be disposed over the seed layer 120, sharing an interface therewith.

As described above, seed layer 120 should undergo partial or full strain relaxation, leading to a distribution of threading dislocations in the seed layer 120. For seed layers of uniform composition, two regimes may be utilized: thin layers of high lattice mismatch or thick layers of low lattice mismatch, as described in more detail below. Also, in some embodiments, the seed layer 120 may be annealed at a temperature above the deposition temperature to facilitate further relaxation prior to subsequent growth of other layers.

FIG. 3 illustrates the qualitative evolution of dislocation pile-up density with seed layer mismatch and thickness variation. Seed layer thicknesses are expressed in terms of the critical thickness ($T_{crit}$) of each layer. Critical thickness defines the maximum thickness at which a fully strained film is at equilibrium. Beyond its critical thickness, a film at equilibrium will undergo partial or complete strain relaxation. Critical thickness is dependent on the lattice mismatch (f) of the film relative to the substrate and thus depends on the discontinuity in Ge content between the film and underlying layer, x, and is described by the following equation (offered by D. Houghton, *Journal of Applied Physics*, 15 Aug. 1991, 2136-2151, incorporated by reference herein):

$$T_{crit}=(0.55/x)\ln(10T_{crit})$$

where $T_{crit}$ is given in nanometers (nm).

Thus, in general, critical thickness decreases as the difference in Ge content x increases. For low Ge content discontinuities or, equivalently, low lattice mismatch (e.g. for x<0.1, corresponding to lattice mismatch of less than 0.4%), critical thickness is relatively large (e.g. greater than 30 nm) and relaxation proceeds relatively slowly as a function of thickness when the critical thickness is exceeded. For high Ge content discontinuities or, equivalently, high lattice mismatch (e.g. for x>0.1, corresponding to lattice mismatch of greater than 0.4%), critical thickness is relatively small and relaxation proceeds relatively quickly as a function of thickness when the critical thickness is exceeded. In some embodiments of the invention, the Ge discontinuity is positive, i.e. the seed layer 120 includes a greater Ge content than the adjacent layers. In other embodiments, the Ge discontinuity is negative, i.e. the seed layer 120 includes a lesser Ge content than the adjacent layers.

Thus, the conditions of partial or complete strain relaxation are governed by the amount of relaxation required to bring a mismatched film into equilibrium, and are a function of lattice mismatch. Kinetic limitations may inhibit equilibrium strain relaxation at low temperatures; however, because the seed layers described in FIG. 3 may be typically grown at temperatures greater than 1000° C., a temperature high enough to ensure equilibrium strain relaxation during growth, layers greater than their $T_{crit}$ will undergo strain relaxation in accordance with the criteria outlined above. In general, any SiGe layer grown above 850° C. should undergo equilibrium strain relaxation.

Embodiments referred to in FIG. 3, featured a 0.5 μm uniform composition $Si_{0.98}Ge_{0.02}$ buffer layer 130, the compositionally graded layer 140 grown via step grading to $Si_{0.8}Ge_{0.2}$ with a step in Ge composition to 4% Ge at the interface between the constant-composition buffer layer 130 and the compositionally graded layer 140, and a 2 μm uniform composition $Si_{0.8}Ge_{0.2}$ cap layer 150.

Still referring to FIG. 3, in various embodiments, the seed layer 120 has a relatively low lattice mismatch with respect to the adjacent layers, and is grown several times its critical thickness at a temperature high enough to ensure equilibrium strain relaxation. In one embodiment, the seed layer 120 is grown, preferably, from above two to about five times its critical thickness. In one example, the seed layer 120 including $Si_{0.94}Ge_{0.06}$ is grown to five times its equilibrium critical thickness on a Si substrate at 1075° C. Of course, this specific embodiment is exemplary only and should not be construed as limiting, as other factors in the growth can affect overall pile-up density. For example, referring to FIG. 2, the grade rate of the compositionally graded layer 140 or the thickness and composition of constant-composition buffer layer 130 will also affect pile-up density. The inclusion of seed layer 120 may reduce DPD from 1-50/cm to <1/cm in the wafer center and from 5-70/cm to <1/cm at the wafer edge (compared to identical samples without the seed layer 120). In some embodiments, including those discussed below, inclusion of the seed layer 120 may reduce DPD to <0.01/cm at both the wafer center and the wafer edge.

Figure 4:
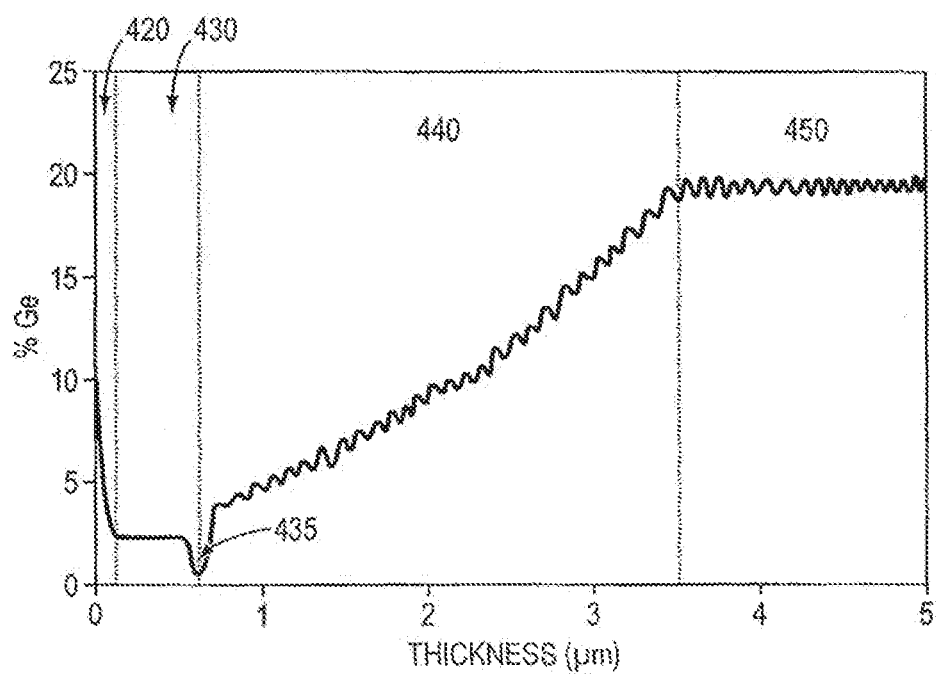
FIG. 4 depicts a graph of germanium concentration in different layers of the semiconductor structure of FIG. 1 plotted versus a schematic representation of its cross-sectional view according to another version of the embodiment of FIG. 1.

Referring to FIG. 4, in other embodiments, as mentioned above, the seed layer itself may comprise a compositional gradient. In these embodiments, the general design requirements for the seed layer are identical as described above, i.e. the entire seed layer structure undergoes partial or full strain relaxation. As shown in FIG. 4, the semiconductor structure incorporates a graded seed layer 420, a constant-composition buffer layer 430, a compositionally graded layer 440 and a uniform composition cap layer 450. The structure also incorporates a discontinuity 435 in Ge composition between the constant-composition buffer layer 430 and the compositionally graded buffer layer 440, wherein the Ge content drops to nearly 0% Ge and then abruptly climbs to approximately 4% Ge.

Figure 5:
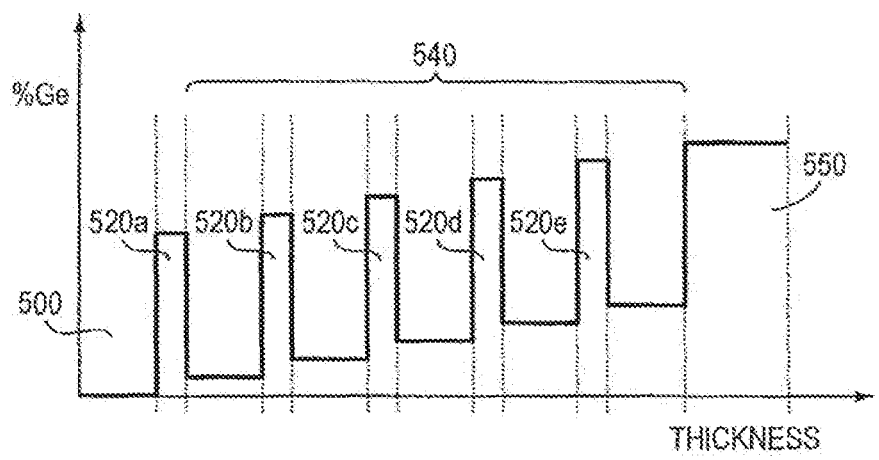
FIG. 5 depicts a graph of germanium concentration in different layers of the semiconductor structure according to an alternative embodiment of the invention.

In other embodiments, one or more seed layers may be incorporated within the compositionally graded layer. Referring to FIG. 5, in one embodiment, the Ge concentration in the substrate 500, multiple seed layers 520, a graded layer 540, and a relaxed cap layer 550 is plotted versus a schematic representation of the cross-section of the semiconductor device. For clarity, the thicknesses of layers 500-550 have been distorted. As shown in FIG. 5, the graded buffer 540 incorporates multiple seed layers 520. The seed layers 520a, 520b, 520c, 520d, and 520e are inserted between discrete steps in the compositionally graded layer 540 grown via step grading. The entire structure is then terminated with a uniform-composition cap layer 550. In this embodiment, the use of multiple seed layers advantageously facilitates uniform distribution of misfit dislocations throughout the entire structure and may thereby reducing DPD even further, as compared to the embodiments having a single seed layer. Additionally, although FIG. 5 depicts multiple seed layers 520 having positive discontinuities in Ge concentration, any of the multiple seed layers 520 may include a negative discontinuity in Ge concentration compared to the adjacent layers.

Notwithstanding the foregoing examples, it should be stressed that the invention is applicable to a wide range of epitaxial growth conditions, including but not limited to any combination of precursor source gases or liquids (such as, for example, silane, dichlorosilane, trichlorosilane, silicon tetrachloride, germane, germanium tetrachloride, and other germanium halides), any growth pressure, any growth temperature, any layer growth rate, and any graded buffer layer grade rate.

Other methods to reduce DPD may be used in lieu of introduction of seed layers without deviating from the scope of the invention. Specifically, in some embodiments of the invention, a substantially uniform distribution of threading dislocations may be formed on a semiconductor substrate by methods other than through growth of a distinct seed layer. For example, in one embodiment, growth of the graded layer is controlled in a predetermined manner so that an initial portion of the relaxed graded layer has a lower local grading rate than at least one subsequent portion. The more uniform relaxation of this initial portion may then provide a substantially uniform distribution of threading dislocations prior to growth and relaxation of the subsequent sublayers of the graded layer. In one version of this embodiment, the difference in local grading rate may be greater than 5% Ge/μm. In another version, the difference in local grading rate may be greater than 20% Ge/μm. In a particular version of this embodiment, the grading rate of the initial portion of the relaxed graded buffer layer may be <10% Ge/μm. Also, the discontinuity in Ge content at the interface between the initial and subsequent portions of the relaxed graded buffer layer may be <10% Ge, for example, <5% Ge.

In still another embodiment, use of the graded layer having substantially uniform distribution of threading dislocations in its initial portion, as described above, may supplement the use of one or more seed layers during the growth of the relaxed graded buffer layer as depicted in FIG. 5.

In yet another embodiment, the semiconductor substrate may be cut from a bulk semiconductor crystal (e.g. a Si wafer cut from a large cylindrical boule of Si) with pre-existing threading dislocations. These threading dislocations are preferably dislocations that will be glissile during subsequent epitaxy of lattice mismatched materials (e.g., the 60° dislocations that relieve lattice mismatch strain in Si, SiGe, and other diamond cubic semiconductors, as recognized by those skilled in the art). Other techniques may also be used to introduce a substantially uniform distribution of threading dislocations on a semiconductor substrate. In one embodiment, the substrate is damaged by ion implantation. This implant damage may form dislocations that are substantially uniformly distributed across the substrate surface. For example, the implantation of species such as Si, Ge, $BF_2$, As, a noble gas, or others may result in enough lattice damage so that dislocations are formed. In another embodiment, a substrate with a rough surface may be used. This may be a substrate, e.g. Si, that has not yet undergone a final polishing step to mirror smoothness (e.g. remnant surface roughness levels greater than <1-2 Å roughness common to Si substrates typical in the art). Alternatively, a smooth Si substrate may be roughened by a physical or chemical process (e.g. physical roughening, etching, oxidation and removal of surface oxide, etc). Growth of lattice-mismatched layers, e.g. compositionally graded buffer layers, on such rough substrates may result in substantially uniform nucleation of threading dislocations across the wafer surface. This may be preferable to non-uniform nucleation of dislocations at relatively few heterogeneous sites on the surface (e.g. surface particles) or at certain locations along the substrate edge.

Use of a substrate having uniform distribution of misfit dislocations, such as a semiconductor substrate having a seed layer deposited thereon (or the ability to tolerate a certain level of dislocation pile-ups) can facilitate high grade rates in overlying graded layers. In general, the desire to avoid high DPDs motivates the use of grade rates lower than, for example, 25% per micrometer (as described in the '413 patent mentioned earlier). While this approach may be suitable for many applications, such low composition gradients result in relatively thick SiGe layers to achieve a given Ge content, which may exhibit certain disadvantages. For example, since wafer bow is a function of thickness and growth temperatures, thicker layers may cause greater wafer bow. As is known to those skilled in the art, this wafer bow can pose problems for subsequent wafer processing steps, such as CMP or lithography. Thicker layers also, of course, imply the use of larger amounts of source material. In addition to the obvious economic disadvantage, use of larger amounts of source material for thicker layers also results in two other drawbacks for epitaxial processing: additional epitaxial reactor wall coating, and additional particle deposition on wafers. Both of these adversely affect wafer quality and economics. Thinner layers may also be preferred for better heat dissipation (in particular, the thermal conductivity of SiGe layers is less than that of comparable Si layers). Accordingly, thinner epitaxial layers may be preferable to thicker layers.

It has been found that acceptable TDDs and DPDs can be achieved with concentration gradients in excess of 25% Ge per micrometer of thickness by using a seed layer (or alternative approaches to achieving substantially uniform distribution of threading dislocations on a semiconductor substrate as described above), or if the rate of deposition (i.e., the epitaxial growth rate) is kept sufficiently low and some pile-ups can be tolerated. In terms of process time, the higher concentration gradient balances a lower deposition rate, so the total epitaxial process time may be similar or even identical to the process times associated with lower grading rates. As a result, the savings in material costs are not offset by sacrifice in terms of time efficiency.

Figure 6:
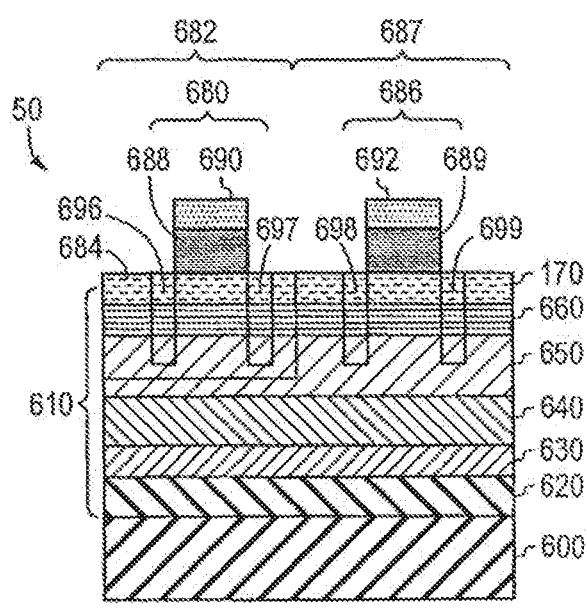
FIG. 6 depicts a schematic cross-sectional view of a CMOS device based on the semiconductor structure of FIG. 1.

Semiconductor wafers having epitaxial layers disposed over the semiconductor substrate, as described above with reference to FIGS. 1-5, may be used for the fabrication of various devices, including, for example, CMOS devices and circuits. Referring to FIG. 6, a p-type metal-oxide-semiconductor (PMOS) transistor 680 is formed in a first region 682 of the semiconductor wafer 50. An n-type well 684 is formed in the layers 110 in the first region 682. An n-type metal-oxide-semiconductor (NMOS) transistor 686 is formed in a second region 687 of the semiconductor wafer 50. The PMOS transistor 680 and the NMOS transistor 686 include, respectively, a first gate dielectric portion 688 disposed over a first portion of the relaxed cap layer 650 and a second gate dielectric portion 689 disposed over a second portion of the relaxed cap layer 650. The first and second gate dielectric portions 688, 689 may comprise a gate oxide such as silicon dioxide. A first gate 690 is disposed over the first gate dielectric portion 688, and a second gate 692 is disposed over the second gate dielectric portion 689. The first and second gates 690, 692 may be formed from a conductive material, such as doped polysilicon, metal, or a metal silicide. A first source 696 and a first drain 697 (defined for purposes of illustration by the interior boundaries) are formed in the first region 682, proximate the first gate 690. The first source 696 and first drain 697 may be formed by the implantation of p-type ions, such as boron. The PMOS transistor 680 includes the first source 696, the first drain 697, the first gate 690, and the first dielectric portion 688. A second source 698 and a second drain 699 (defined for purposes of illustration by the interior boundaries) are formed in the second region 687, proximate the second gate 692. The second source 698 and the second drain 699 may be formed by the implantation of n-type ions, such as phosphorus. The NMOS transistor 686 includes the second source 698, the second drain 699, the second gate 692, and the second dielectric portion 689. Either of strained layers 160 and 170 may be absent from either transistor structure after fabrication.

Semiconductor wafers having epitaxial layers disposed over the semiconductor substrate, as described above with reference to FIGS. 1-5, may be used for the fabrication of various other structures, including, for example, strained semiconductor on insulator (SSOI) substrates. Such fabrication may be accomplished by wafer bonding of a semiconductor structure to a handle wafer comprising an insulator. Referring briefly to FIG. 1, the substrate 100 and layers 110 are then removed, resulting in either or both of strained layers 160, 170 being disposed on the handle wafer. Alternately, the strained layers 160, 170 may be absent from semiconductor structure 50 prior to bonding, and a portion of the relaxed cap layer 150 may be disposed on the handle wafer after bonding and removal of the substrate 100 and the rest of layers 110. Semiconductor layers, including strained layers, may then be disposed on either final SSOI structure. Techniques for creating SSOI structures, while well-known in the art, are further described, for example, in U.S. Pat. No. 6,602,613, incorporated herein by reference.

The invention may be embodied in other specific forms without departing from the spirit of essential characteristics thereof. The foregoing embodiments are therefore to be considered in all respects illustrative rather than limiting on the invention described herein.

What is claimed is:

1. A method comprising:
    epitaxially growing a first semiconductor layer on a crystalline material of a substrate, the first semiconductor layer having a plurality of threading dislocations across a surface thereof, a threading dislocation density of the first semiconductor layer varying across the surface by no more than one order of magnitude;
    epitaxially growing a graded layer over the first semiconductor layer; and
    epitaxially growing a strained layer over the graded layer.

2. The method of claim 1, wherein the plurality of threading dislocations are distributed substantially uniformly across the surface of the first semiconductor layer.

3. The method of claim 1, wherein the strained layer is tensilely strained.

4. The method of claim 1, wherein the strained layer is compressively strained.

5. The method of claim 1, wherein a discontinuity is at an interface between the first semiconductor layer and an adjacent overlying layer.

6. The method of claim 1 further comprising:
epitaxially growing a buffer layer over the first semiconductor layer, the buffer layer having a different composition than the first semiconductor layer, the graded layer being epitaxially grown over the buffer layer.

7. The method of claim 1 further comprising:
forming a compositionally uniform cap layer over the graded layer, the strained layer being epitaxially grown over the compositionally uniform cap layer.

8. The method of claim 7, wherein a lattice constant of the compositionally uniform cap layer is different from a lattice constant of the first semiconductor layer.

9. A method comprising:
forming a seed layer on a substrate, the seed layer comprising a compositionally uniform portion, a composition of the compositionally uniform portion being different from a composition of a material adjoining and underlying the seed layer, a concentration discontinuity of a first element being at an interface between the seed layer and an adjacent overlying layer;
forming a graded layer over the seed layer; and
forming a strained layer over the graded layer.

10. The method of claim 9, wherein the composition of the compositionally uniform portion of the seed layer is different from a composition of a material overlying the seed layer.

11. The method of claim 9, wherein the first element is germanium.

12. The method of claim 9, wherein the concentration discontinuity is a positive concentration discontinuity.

13. The method of claim 9, wherein the concentration discontinuity is a negative concentration discontinuity.

14. The method of claim 9, wherein the seed layer comprises a compositional gradient portion between the material adjoining and underlying the seed layer and the compositionally uniform portion.

15. The method of claim 9 further comprising:
forming a buffer layer over the seed layer, the buffer layer adjoining and overlying the seed layer, the buffer layer being compositionally uniform.

16. The method of claim 9 further comprising:
forming a relaxed cap layer over the graded layer, the strained layer being formed over the relaxed cap layer.

17. A method comprising:
forming a relaxed semiconductor layer over a substrate, the relaxed semiconductor layer being a compositionally uniform first crystalline material;
a second semiconductor layer adjoining and overlying the relaxed semiconductor layer, the second semiconductor layer comprising a second crystalline material, a composition of the first crystalline material of the relaxed semiconductor layer being different from a composition of the second crystalline material of the second semiconductor layer, the second semiconductor layer being a relaxed graded layer; and
forming a strained layer over the second semiconductor layer.

18. The method of claim 17, wherein the second semiconductor layer is a compositionally uniform buffer layer.

19. The method of claim 17, wherein the second semiconductor layer comprises silicon and germanium.

20. The method of claim 17, wherein the strained layer is compressively strained.

* * * * *